United States Patent [19]

Chang

[11] 3,875,535

[45] Apr. 1, 1975

[54] ENHANCED EFFICIENCY DIODE CIRCUIT

[75] Inventor: Kern Ko Nan Chang, Princeton, N.J.

[73] Assignee: RCA Corporation, New York, N.Y.

[22] Filed: May 24, 1973

[21] Appl. No.: 363,668

[52] U.S. Cl. ............... 332/30 V, 307/317, 307/320, 331/107 R, 331/177 V, 332/52

[51] Int. Cl. .......................... H03c 3/22, H03b 7/06

[58] Field of Search ............ 332/30 V, 52; 307/326, 307/317; 331/36 C, 107 R, 107 G, 107 P, 177 V (U.S. only)

[56] References Cited

UNITED STATES PATENTS

| | | | |
|---|---|---|---|
| 3,141,141 | 7/1964 | Sharpless | 331/107 T |
| 3,225,317 | 12/1965 | Yasuda et al. | 331/107 T X |
| 3,465,265 | 9/1969 | Kuru | 331/36 C X |
| 3,524,149 | 8/1970 | Socci | 332/52 X |
| 3,675,161 | 7/1972 | Teramoto et al. | 331/107 R X |
| 3,705,364 | 12/1972 | Takeshima | 331/107 G X |
| 3,721,919 | 3/1973 | Grace | 331/107 R X |
| 3,743,966 | 7/1973 | Grace | 331/107 R X |

OTHER PUBLICATIONS

Slaymaker et al., "Efficient Power Extraction at Trapatt Harmonies," Electronics Letters (12 Nov. 1970), Vol. 6, No. 23, pp. 744–746.

*Primary Examiner*—Alfred L. Brody
*Attorney, Agent, or Firm*—Edward J. Norton; Joseph D. Lazar; Michael A. Lechter

[57] ABSTRACT

A varactor diode is combined with a microwave frequency diode in order to enhance the efficiency of the microwave diode. The varactor diode, which functions as a harmonic enhancer, greatly improves the efficiency of the microwave diode when the tuned diode circuit is used in place of the microwave diode to a TRAPATT oscillator.

9 Claims, 2 Drawing Figures

ENHANCED EFFICIENCY DIODE CIRCUIT

The invention disclosed herein was made in the course of, or under, a contract or subcontract thereunder with the Department of the Air Force.

BACKGROUND OF THE INVENTION

The present invention relates to high frequency diode circuits, and in particular it relates to microwave frequency avalanche diodes which are highly efficient, high power devices.

Microwave diodes, normally known as IMPATT diodes, are used as microwave oscillators. These microwave diodes are used to produce microwave frequency oscillations. Heretofore, the efficiency of such diodes at very high frequencies has not been as high as would be desired.

The paper of Prager et al "High-Power High-Efficiency Silicon Avalanche Diodes at Ultra High Frequencies," *Proceedings of the IEEE*, Vol. 55, April 1967, pages 586–587, describes an IMPATT diode used in an oscillator circuit that gives higher efficiency than would be normally predicted from IMPATT diode theory. This high-efficiency oscillator is now known as the TRAPATT mode, an acronym for TRApped Plasma Avalanche Triggered Transit. While more efficient than other IMPRATT oscillators, a problem with the TRAPATT mode oscillator has been the stringent requirements governing the design of the avalanche diode used, because the diode is required to perform both a plasma formation function and a harmonic generation function.

SUMMARY OF THE INVENTION

A diode circuit is presented which comprises a microwave diode having a junction capacitance and a variable capacitor element coupled in parallel with the microwave diode, the variable capacitive element having a capacitance which is within 25 percent of the characteristic junction capacitance of the microwave diode.

DETALIED DESCRIPTION OF THE PREFERRED EMBODIMENT

Figure 1:
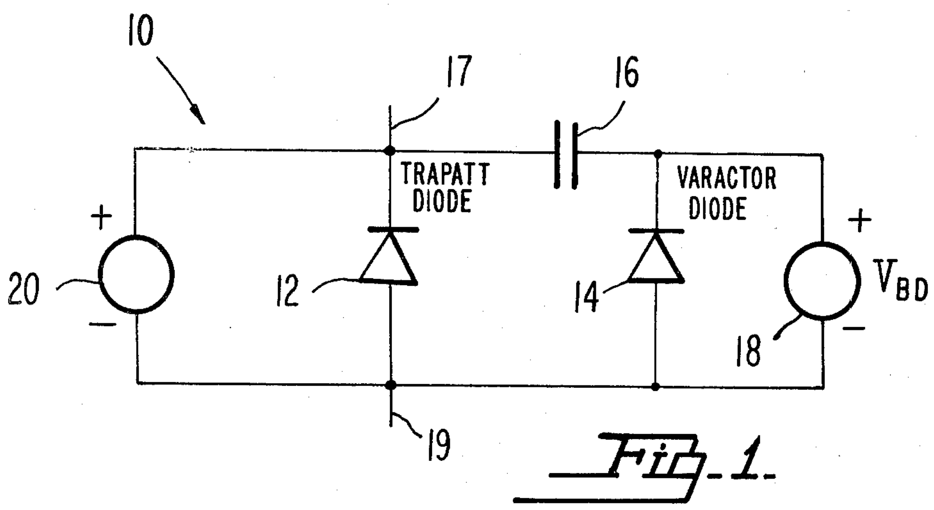
FIG. 1 is a schematic diagram of one embodiment of the present invention.

Referring generally to FIG. 1, one embodiment of the enhanced efficiency diode circuit 10 is shown. The circuit 10 comprises a microwave diode 12 such as an avalanche diode, a variable capacitor element such as a varactor diode 14, and a coupling element. In the preferred embodiment, the coupling element is a capacitor 16. The diode circuit 10 further comprises a pair of power supplies 18 and 20 which are used to bias the varactor diode 14 and the avalanche diode 12 respectively.

A varactor diode functions as a harmonic enhancer. An avalanche diode is essentially a punch-through device, and as such it may be inefficient for harmonic generation. Rich harmonic content is necessary for high efficiency operation of avalanche diodes. However, the design of avalanche diodes is too critical for such diodes to perform both the plasma formation function and the harmonic generation function in an efficient manner in the TRAPATT mode. The invention of the present circuit 10 provides a means for separating the plasma formation and harmonic generation functions which are required for the efficient operation of a microwave frequency generator. The varactor diode 14 gives a separate means for providing the necessary frequency harmonics without the consumption of power from the avalanche diode 12. The varactor diode 14 thereby enhances the operation of the avalanche diode 12 which can then be used primarily for the plasma formation function. In the preferred embodiment of the diode circuit 10, the junction capacitance of the avalanche diode 12 should be matched within about 25% by the varactor capacitance. Furthermore, it has been found to be advantageous for the varactor diode 14 to have a breakdown voltage of approximately $2V_{BD}$, where $V_{BD}$ is the breakdown voltage of the avalanche diode 12. The DC biasing supply 18 for the varactor diode is preferably chosen to be on the order of $V_{BD}$, the breakdown voltage for the avalanche diode 12.

In order to use the circuit 10 in a microwave oscillator operated in the TRAPATT mode, leads 17 and 19 are connected to the avalanche diode 12. The leads 17, 19 are connected in a TRAPATT oscillator in the same manner that an avalanche diode alone would be connected in such oscillator. It has been found that through the use of the diode circuit 10 of the preferred emobdiment, the overall efficiency of the circuit 10 is approximately twice that of the avalanche diode 12 without the varactor diode 14. Furthermore, it has been found that the varactor diode 14 when used in this circuit 10 does not have a tuning effect upon the circuit whose frequency of operation remains constant, but the effect of the varactor diode 14 is to increase the overall efficiency substantially as previously noted.

Figure 2:
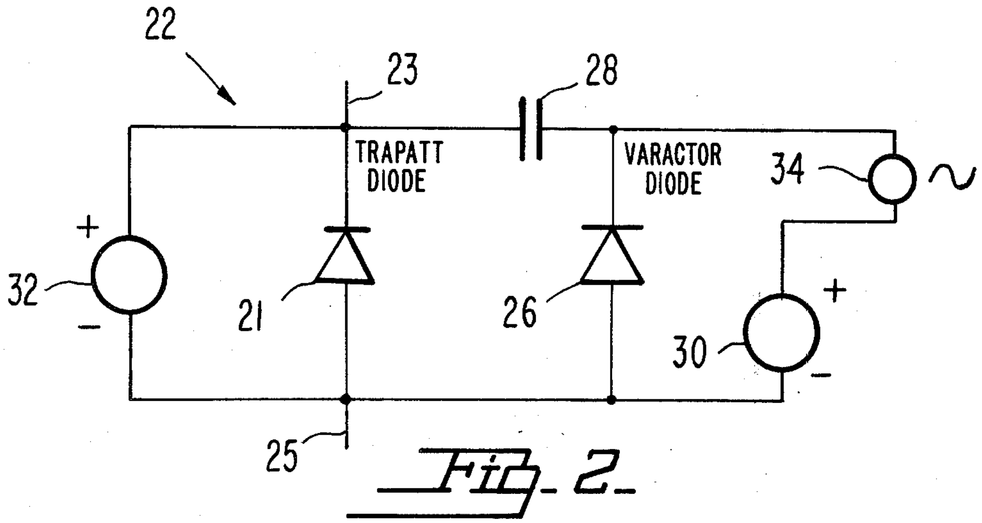
FIG. 2 is a schematic diagram of another embodiment of the present invention.

Referring generally to FIG. 2, an amplitude modulation circuit 22 which makes use of the present invention is shown. The amplitude modulation circuit 22 comprises a high frequency microwave diode such as an avalanche diode 24, a varactor diode 26, a coupling device between the diodes 24, 26 such as a capacitor 28, and a pair of DC bias supplies 30, 32 which bias the varactor diode 26 and the avalanche diode 24 respectively. The amplitude modulation circuit 22 further comprises a modulating device. In the preferred embodiment of the amplitude modulation circuit 22, this modulating device is an AC modulation source 34. The modulation source 34 could be replaced by a microphone or other such device as will be understood by one skilled in the art.

The operation of the amplitude modulation circuit 22 is essentially the same as that of the enhancement circuit 10 of FIG. 1, and like the enhancement circuit 10, the modulation circuit 22 is connected to a microwave oscillator circuit by leads 23 and 25 which are connected across the avalanche diode 24. In the amplitude modulation circuit 22, however, the presence of the modulation source 34 causes the capacitance of the varactor diode 26 to vary in accordance with variations of the modulation source 34. This in turn varies the efficiency of the overall circuit 22, thereby amplitude modulating the microwave frequency oscillations of the avalanche diode 24. This modulation circuit 22 operates essentially by changing the power efficiency of the avalanche diode 24 through changes in the harmonic generation of the varactor diode 26. This has been shown to be a simple and efficient means for supplying amplitude modulated microwave signals.

I claim:

1. An enhanced efficiency diode circuit comprising:

a. a microwave diode arranged to operate in a TRAPATT mode in response to a bias signal to form a plasma and generate signals at harmonically related frequencies;

b. a voltage variable capacitor element arranged to generate signals at harmonically related frequencies in response to said diode generated signals; and c. means for coupling said microwave diode generated signals to said voltage variable capacitor element so that said signals generated by said capacitor element enhance operating efficiency of said microwave diode.

2. The diode circuit of claim 1 wherein said variable capacitor element is a varactor diode coupled in parallel with said microwave diode.

3. The diode circuit of claim 1 wherein said means for coupling said microwave diode generated signals to said voltage variable capacitor element includes a capacitor.

4. The diode circuit of claim 1 further comprising means for biasing said microwave diode.

5. The diode circuit of claim 4 further comprising means for biasing said variable capacitor element.

6. The diode circuit of claim 5 further comprising means for varying the bias on said variable capacitor element.

7. The diode circuit of claim 6 wherein said means for biasing said variable capacitor element comprises a DC bias supply.

8. The diode circuit of claim 7 wherein said means for varying the bias on said variable capacitor element comprises an AC modulation source.

9. The diode circuit of claim 8 wherein said means for biasing said microwave diode comprises a DC bias supply.

* * * * *